United States Patent
Izumida et al.

(10) Patent No.: US 6,189,674 B1
(45) Date of Patent: Feb. 20, 2001

(54) APPARATUS AND METHOD FOR TRANSFERRING PRINTED CIRCUIT BOARDS

(75) Inventors: Keizo Izumida, Yamasashi-ken; Hiroki Yamamoto; Kazuo Nagae, both of Kofu, all of (JP)

(73) Assignee: Matsushita Electric Industrial Co., Ltd. (JP)

( * ) Notice: Under 35 U.S.C. 154(b), the term of this patent shall be extended for 0 days.

(21) Appl. No.: 09/201,876

(22) Filed: Nov. 30, 1998

(30) Foreign Application Priority Data

Nov. 28, 1997 (JP) .................................................. 9-326839

(51) Int. Cl.$^7$ .................................................. B65G 43/00
(52) U.S. Cl. .................. 198/341.01; 198/345.1; 198/464.12
(58) Field of Search ............................ 198/341.01, 345.1, 198/464.2, 464.3

(56) References Cited

U.S. PATENT DOCUMENTS

| | | | |
|---|---|---|---|
| 4,516,673 | * | 5/1985 | Kashihara et al. ............... 198/341.01 |
| 4,754,867 | * | 7/1988 | DeAnda ............................ 198/464.2 |
| 4,997,077 | * | 3/1991 | Meini et al. ...................... 198/464.2 |
| 5,517,748 | * | 5/1996 | Park ..................................... 29/741 |
| 5,657,538 | * | 8/1997 | Ishii .................................. 198/345.1 |
| 5,873,155 | * | 2/1999 | Jokela .................................. 198/414 |
| 5,937,992 | * | 8/1999 | Davis et al. ..................... 198/341.01 |
| 5,975,835 | * | 11/1999 | Mochida et al. ................. 198/345.1 |
| 6,032,577 | * | 3/2000 | Doyle .................................. 101/129 |
| 6,112,905 | * | 9/2000 | O'Connor et al. ................ 198/345.1 |

\* cited by examiner

Primary Examiner—Douglas Hess
(74) Attorney, Agent, or Firm—Parkhurst & Wendel, L.L.P.

(57) ABSTRACT

An apparatus and a method for transferring a printed circuit board to an intended position at a high speed accurately and reliably. The apparatus is provided with driving motors (7) for driving conveyor belts (6) to transfer a printed circuit board, a positioning detector (10) for detecting said printed circuit board (5) having hit a positioning stopper (9) in the intended position, an arrival detector (11) for detecting said printed circuit board having arrived in a prescribed position before the intended position, a control unit (13) for controlling the driving motors (7) in accordance with said detection signals from both detectors (10, 11), whereby the transfer speed starts to slow down when said printed circuit board arrives at said arrival detector, and if the printed circuit board hits said stopper and bounces back, or it fails to reach the intended position because a slip occurs between said printed circuit board and said conveyor belts, said control unit drives said driving motors again to run at a slow speed until said printed circuit board hits said stopper.

6 Claims, 4 Drawing Sheets

APPARATUS AND METHOD FOR TRANSFERRING PRINTED CIRCUIT BOARDS

FIELD OF THE INVENTION

The present invention relates to an apparatus and a method for transferring printed circuit boards.

BACKGROUND ART

Electronic components have become diversified in recent years, entailing the need for high-speed and highly accurate mounting of electronic components on printed circuit boards. Therefore, for high-speed and highly accurate mounting of electronic components on printed circuit boards, it is necessary to transfer and place printed circuit boards in prescribed positions quickly and with high accuracy.

Conventional apparatuses for transferring and positioning printed circuit boards in prescribed positions include what is shown in FIG. 4. This transfer apparatus 20 comprises such driving units as transfer rails 22, on which a printed circuit board 21 is to be transferred and guided; a vertically movable hook 23 disposed beside one of the transfer rails 22; a mechanism 24 for moving the hook 23 up and down; a guide rail 25 for guiding the hook 23 back and forth in parallel with the transfer rails 22; and a cylinder unit 26 for moving the hook 23 back and forth along the guide rail 25. The hook 23 is engaged in an engaging hole 27 formed in the printed circuit board 21, and the driving units are driven to move the hook 23 along the guide rail 25 to transfer and place the printed circuit board 21 in a prescribed position.

However, the above-described conventional transfer apparatus 20 requires, separately from the transfer rails 22, driving units for moving the hook 23 in parallel with the transfer rails 22; the mechanism 24 for moving the hook 23 up and down; and the guide rail 25 for moving the hook 23 back and forth in parallel with the transfer rail 22, resulting in a greater size and complexity of the whole apparatus. This leads to problems regarding costs and installation space, and the printed circuit board 21 itself requires the engaging hole 27 for engaging the hook 23, which limits the range of usable printed circuit boards 21.

In this connection, there is also available, as shown in FIG. 5, a transfer apparatus provided with a conveyor belt 30 for guiding and transferring a printed circuit board 21 seated thereon is disposed on a frame 31 via a belt-driving unit 32, and a stopper 33 for placing the printed circuit board 21 in a prescribed position, whereby the printed circuit board 21 is seated on the conveyor belt 30 and transferred to the stopper 33 by running the belt-driving unit 32.

This transfer apparatus 20 can transfer the printed circuit board 21 in a simple configuration, but, if the conveyor belt 30 is run too fast when it transfers the printed circuit board 21, the printed circuit board 21 may fail to be positioned exactly where it should be or electronic components mounted thereon may be dislocated or damaged by any impact that may occur when the printed circuit board 21 hits the stopper 33 even if it comes into contact with the stopper 33 in the prescribed position.

In order to solve the above-mentioned disadvantages, another apparatus is available, which effects control to lower the transfer speed of the conveyor belt 30 before the printed circuit board 21 hits the stopper 33.

This can ease the impact of the printed circuit board 21 hitting the stopper 33 and also restrain the dislocation of, or the occurrence of defects in, the electronic components. However, because the printed circuit board 21 and the conveyor belt 30 are in frictional contact with each other, if a slip occurs between the printed circuit board 21 and the conveyor belt 30, the printed circuit board 21 cannot slow down to the level of the lowered speed of the conveyor belt 30, with the possible result that the printed circuit board 21 hits the stopper 33 with an unnecessarily great impact or, conversely, the printed circuit board 21 may be transferred at a lower speed than the conveyor belt 30, taking too long a transfer time. Either trouble makes it difficult to realize high-speed transfers of the printed circuit board 21.

DISCLOSURE OF THE INVENTION

An object of the present invention, therefore, is to provide an apparatus and a method for transferring printed circuit boards capable of obviating the above-described disadvantages.

As a means to solve the problems according to the present invention, the apparatus is provided with conveyor belts for seating a printed circuit board thereon; driving units for running the conveyor belts; a stopper for placing the printed circuit board in an intended position; a positioning detector for detecting the printed circuit board having hit the stopper; an arrival detector for detecting the printed circuit board having arrived in a prescribed position before the intended position where the printed circuit board ends its transfer; and a control unit for controlling the driving by the driving units in accordance with detection signal from the positioning detector and the arrival detector. This control unit has a function to output a slowdown signal to the driving units according to a detection signal from the arrival detector; a function to effect a delay by a prescribed period of time to stand by for a detection signal from the positioning detector, when a detection signal from the positioning detector and drive-stop signals from the driving units are output after a lapse of a standby period following the output of the slowdown signal; a function to determine that the printed circuit board has been placed in the intended position according to the detection signal output after the delay by the prescribed period of time; a function to supply a low-speed signal to the driving units to drive the conveyor belts at a low speed when no detection signal is output after the delay by the prescribed period of time; and a function to determine that the printed circuit board has been placed in the intended position by outputting a drive-stop signal to the driving units in accordance with a detection signal from the positioning detector after this low-speed signal is output.

According to this configuration, the transfer speed of the conveyor belts begins to be slowed down when the printed circuit board has arrived in the prescribed position before the intended position and, if the printed circuit board does not hit the stopper by the time the conveyor belts stop after their transfer speed begins to slow down, the conveyor belts are again driven to run at a slow speed until the printed circuit board hits the stopper so that the printed circuit board can be transferred to the intended position quickly and reliably.

The apparatus may also be provided with conveyor belts for seating a printed circuit board thereon; driving units for driving the conveyor belts; a stopper for placing the printed circuit board in an intended position; a positioning detector for detecting the printed circuit board having hit the stopper; an arrival detector for detecting the printed circuit board having arrived in a prescribed position before the intended position where the printed circuit board ends its transfer; and a control unit for controlling the driving of the driving units in accordance with detection signals from the positioning detector and the arrival detector, wherein the control unit has a function to supply a slowdown signal to the driving units according to a detection signal from the arrival detector; a function to supply a low-speed signal to the driving units to drive the conveyor belts at a low speed when no detection signal is output from the positioning detector and drive-stop signal are output from the driving units after a lapse of a standby period of time following the output of the slowdown signal; and a function to determine that the printed circuit board has been placed in the intended position by outputting a drive-stop signal to the driving units in accordance with a detection signal from the positioning detector after the low-speed signal is output.

According to this configuration, the transfer speed of the conveyor belts begins to be slowed down when the printed circuit board has arrived in the prescribed position before the intended position and, if the printed circuit board does not hit the stopper by the time the conveyor belts stop after their transfer speed begins to slow down, the conveyor belts are again driven to run at a slow speed until the printed circuit board hits the stopper so that the printed circuit board can be transferred to the intended position quickly and reliably.

The apparatus may also be provided with conveyor belts for seating a printed circuit board thereon; driving units for driving the conveyor belts; a stopper for placing the printed circuit board in an intended position; a positioning detector for detecting the printed circuit board having hit the stopper; an arrival detector for detecting the printed circuit board having arrived in a prescribed position before the intended position where the printed circuit board ends its transfer; and a control unit for controlling the driving of said driving units in accordance with detection signal from the positioning detector and the arrival detector, wherein the control unit has a function to supply a slowdown signal to the driving units according to a detection signal from the arrival detector; a function to effect a delay by a prescribed period of time to stand by for a detection signal from the positioning detector, when a detection signal from the positioning detector and drive-stop signal from the driving units are output after a lapse of a standby period of time following the output of the slowdown signal; a function to determine that the printed circuit board has been placed in the intended position according to the detection signal output after the delay by the prescribed period of time; a function to output a low-speed signal to the driving units to drive the conveyor belts at a low speed when no detection signal is output from the positioning detector; and a function to determine that the printed circuit board has been placed in the intended position by outputting a drive-stop signal to the driving units in accordance with a detection signal from the positioning detector after the low-speed signal is output. The control unit further has a function to output a low-speed signal to the driving units to drive the conveyor belts at a low speed when no detection signal is output from the positioning detector and drive-stop signal are output from the driving units after a lapse of a standby period of time following the output of the slowdown signal; and a function to determine that the printed circuit board has been placed in the intended position by outputting a drive-stop signal to the driving units in accordance with a detection signal from the arrival detector after the low-speed signal is output.

According to this configuration, the transfer speed of the conveyor belts begins to be slowed down when the printed circuit board has arrived in the prescribed position before the intended position and, if the printed circuit board does not hit the stopper by the time the conveyor belts stop after their transfer speed begins to slow down, the conveyor belts are again driven to run until the printed circuit board hits the stopper. Or, if the printed circuit board hits the stopper and bounces back by the time the conveyor belts stop after their transfer speed begins to slow down, the conveyor belts are again driven to run at a slow speed until the printed circuit board hits the stopper so that the printed circuit board can be transferred to the intended position quickly and reliably.

DESCRIPTION OF THE EMBODIMENT

Figure 1:
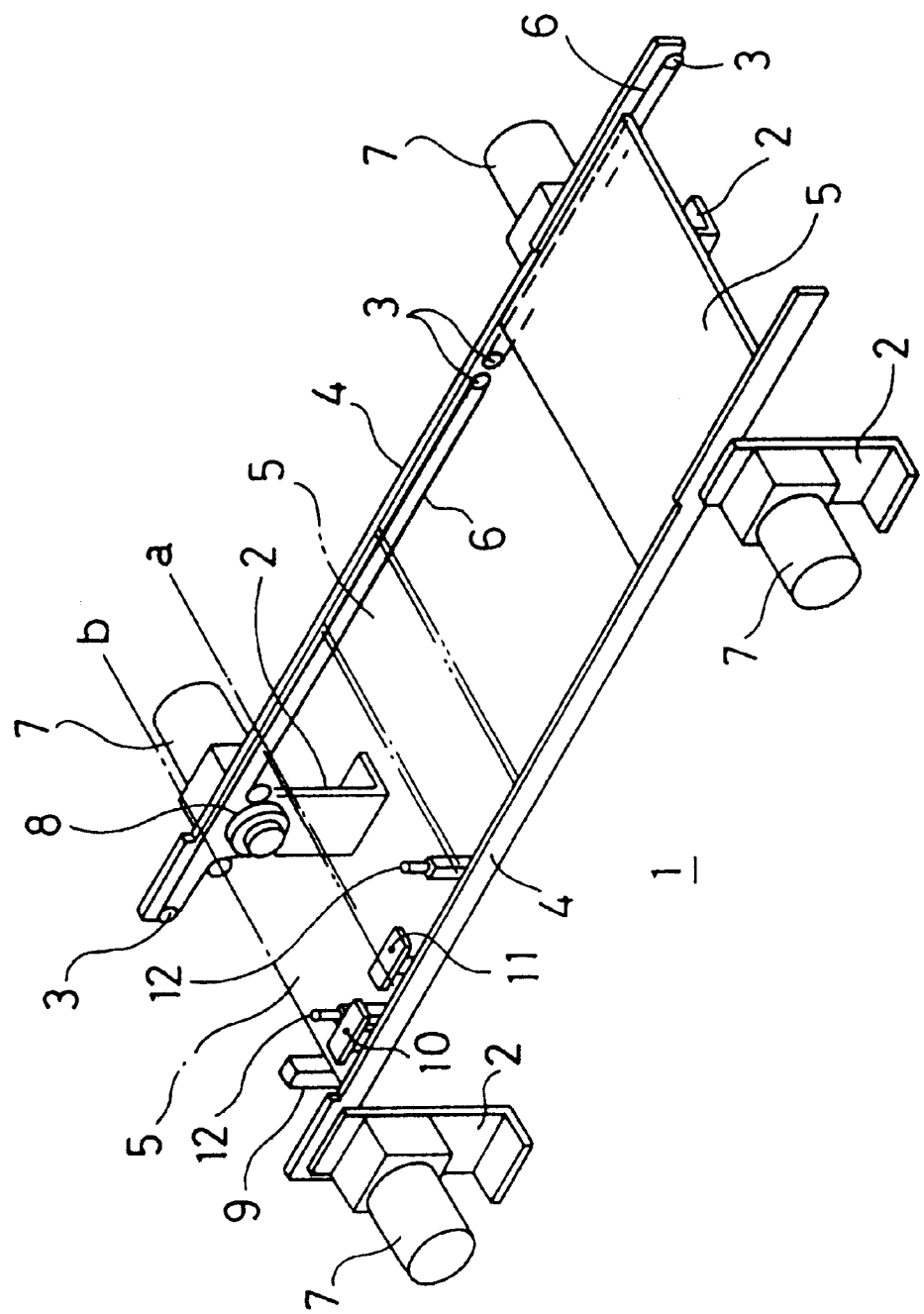
FIG. 1 is a schematic perspective view of an overall configuration of an apparatus for transferring printed circuit boards, according to a preferred embodiment of the present invention.

A preferred embodiment of the present invention will be described below with reference to FIGS. 1 to 3. An apparatus for transferring printed circuit boards which is the preferred embodiment of the invention, as shown in the perspective view of FIG. 1, is provided with a pair of conveyor frames 4 disposed in parallel with an installation base 1 via legs 2, having a plurality of pulleys 3 on opposite sides; two pairs of conveyor belts 6 for seating a printed circuit board 5 thereon and transferring the printed circuit board 5, each wound around prescribed ones of the pulleys 3; and a plurality of driving motors 7 (one example of driving units) for running each conveyor belt 6. Each driving motor 7, fitted to one or another of said legs 2, has a driving pulley 8 mounted on its output shaft so that the running of each driving motor 7 causes the driving force of each driving pulley 8 to be transmitted to and turn a conveyor belt 6.

Figure 2:
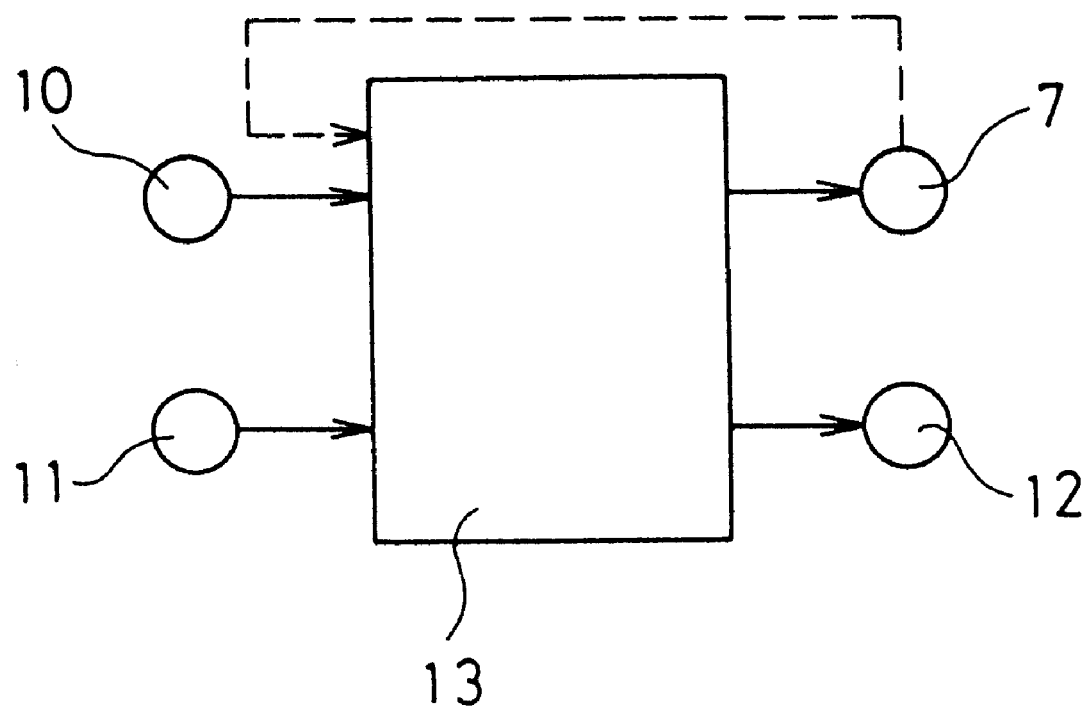
FIG. 2 is a control block diagram of the same.
Figure 3:
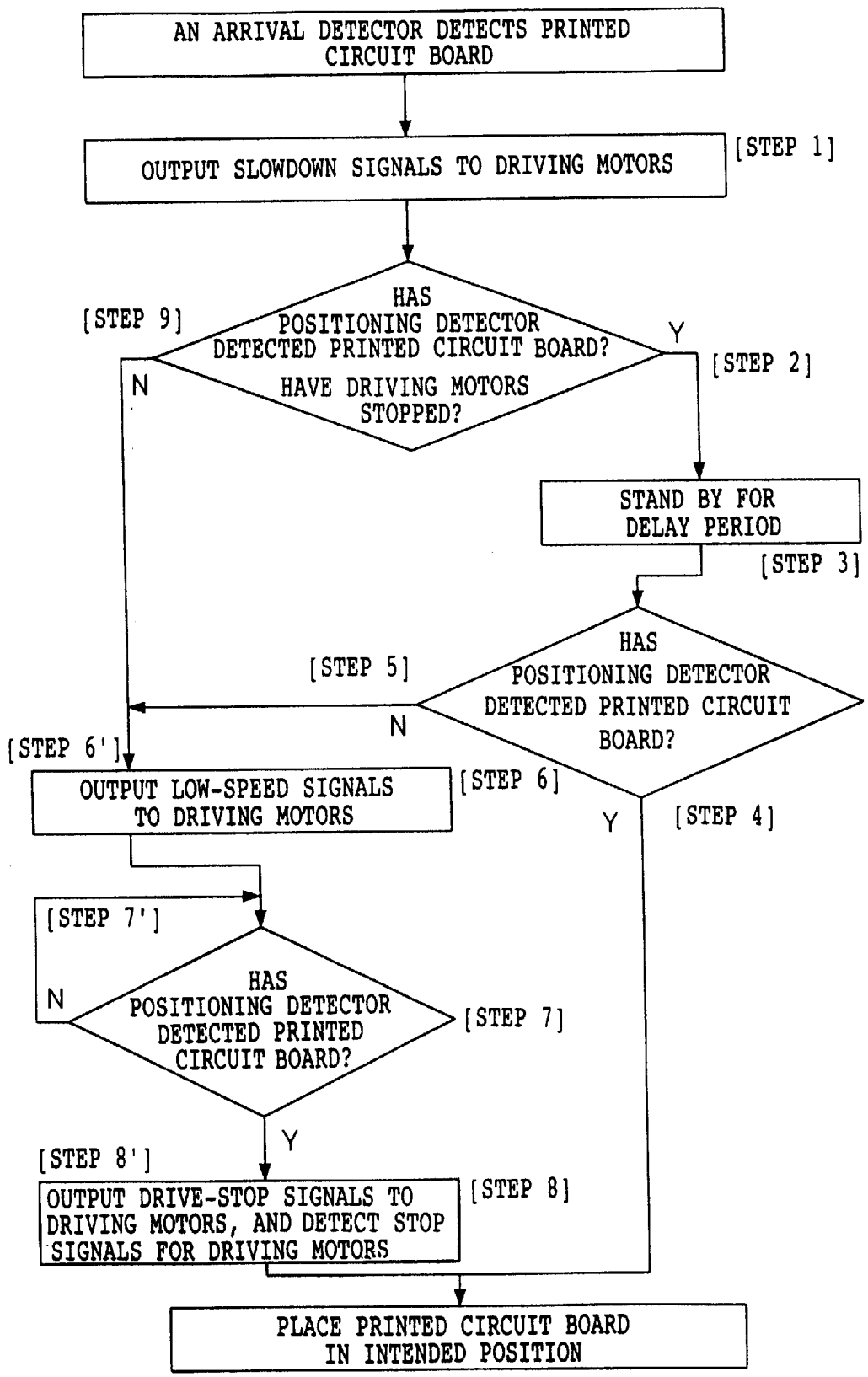
FIG. 3 is a control flow chart of the same.
Figure 4:
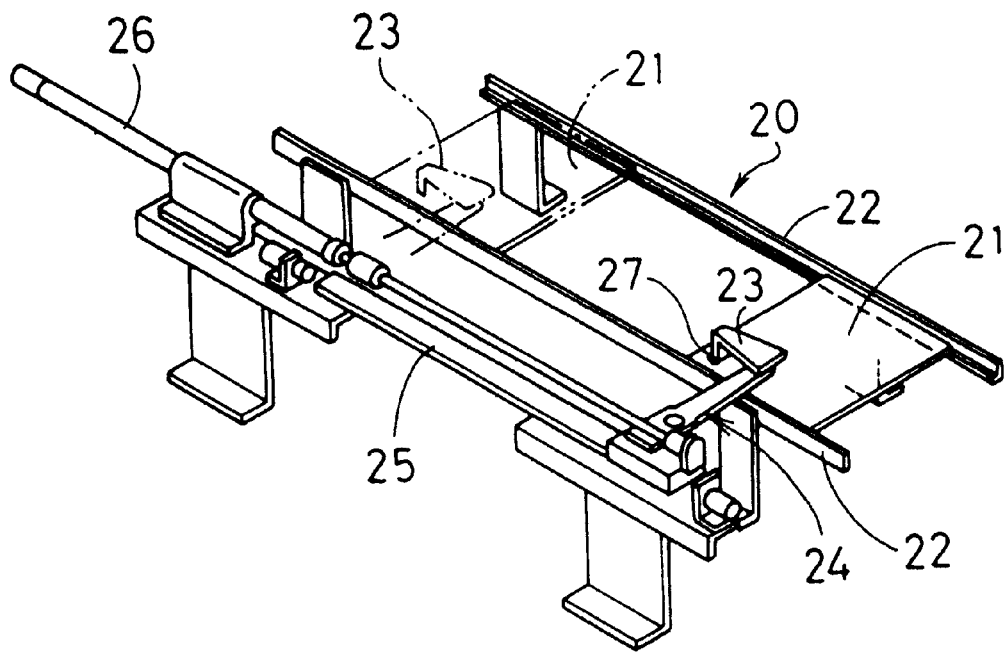
FIG. 4 is a schematic perspective view of an overall configuration of a conventional apparatus for transferring printed circuit boards.
Figure 5:
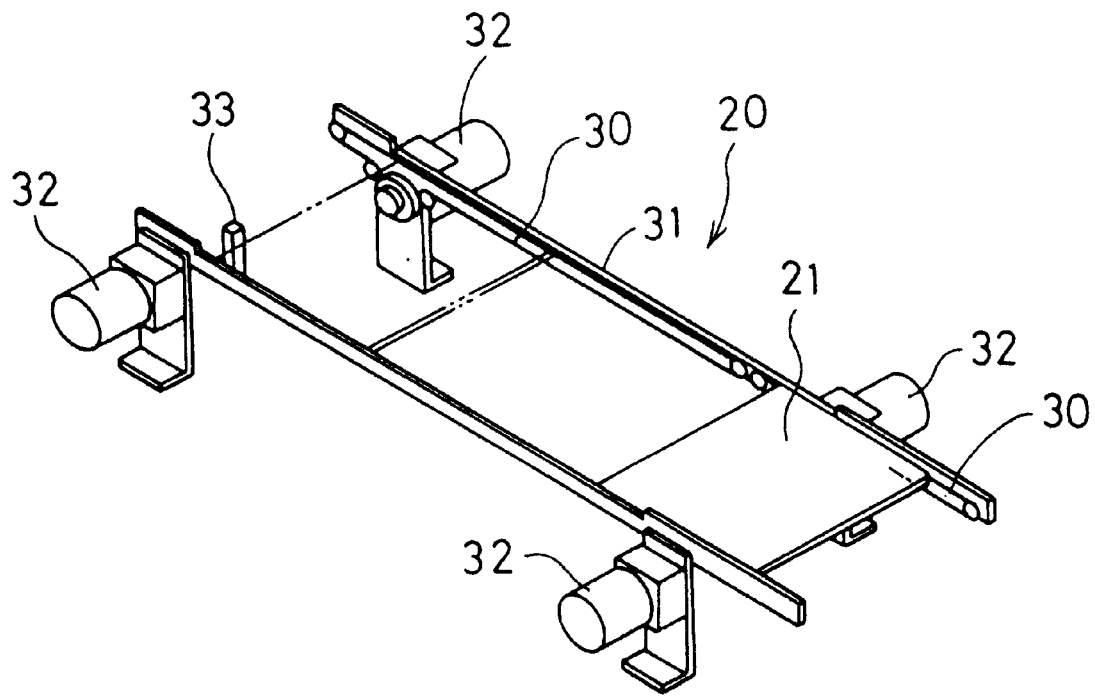
FIG. 5 is a schematic perspective view of an overall configuration of another conventional apparatus for transferring printed circuit boards.

Also, one of the conveyor frames 4 is provided with a stopper 9, retractable from the transfer surface, for placing the printed circuit board 5 in an intended position; a positioning detector 10 for detecting the hitting of the printed circuit board 5 against the stopper 9; an arrival detector 11 for detecting the arrival of the printed circuit board 5 in a prescribed position (position "a" in FIG. 1) before the intended position where the printed circuit board ends its transfer; a positioner 12, retractable from the transfer surface, for placing the printed circuit board 5 in a certain state in the intended position (position "b" in FIG. 1); and a control unit 13 for controlling the driving of each of said driving motors 7 in accordance with detection signals from said positioning detector 10 and said arrival detector 11; wherein as shown in FIG. 2, said positioning detector 10 and said arrival detector 11 are connected to the input side of the control unit 13, and the drive section of each driving motor 7 and the positioner 12 are connected to the output side of the control unit 13.

Next, a method for transferring the printed circuit board 5 by the above-described configuration will be described with reference to FIG. 3. Seating of the printed circuit board 5 in a transfer start position actuates the control unit 13 to output a drive signal to each driving motor 7 to drive the corresponding conveyor belt 6 at a high speed, and the printed circuit board 5 is thereby transferred to the intended position at a high speed where the stopper 9 stands protruding above the transfer surface. On the way, when the printed circuit board 5 arrives in the arrival position, i.e. position "a" in FIG. 1, a detection signal from the arrival detector 11 is output to the control unit 13, and the control unit 13 outputs a slowdown signal to the driving motors 7 [Step 1], which reduces the transfer speed of the conveyor belts 6, and causes the printed circuit board 5 to start slowing down in a prescribed acceleration toward halt.

To add, this prescribed acceleration is an acceleration at which the conveyor belt 6 starts slowing down from the arrival position and the printed circuit board 5 barely passes the intended position and stops.

Then, if a detection signal from the positioning detector 10 and drive-stop signals from driving motors 7 are output after a standby period has passed from the time the slowdown signal was output [Step 2], the detection signal from the positioning detector 10 is further caused to stand by for a delay period (0.1 s, for example). [Step 3]. During this delay period, if the detection signal from the positioning detector 10 is output [Step 4], the printed circuit board 5 is determined to have hit the stopper 9 and been placed in the intended position, i.e. position "b". Then the control unit 13 lifts the positioner 12 up to the transfer surface, and the printed circuit board 5 is thereby securely held in the intended position.

However, if a detection signal from the positioning detector 10 has once been output, but no more detection signal from the positioning detector 10 is output during the delay period [Step 5], the printed circuit board 5 is determined to have hit the stopper 9 and bounced back, thus not being in contact with the stopper 9, so that the control unit 13 outputs a low-speed signal to each driving unit 7 to drive the conveyor belt 6 to run again at a low speed [Step 6].

Then, in response to a detection signal from the positioning detector 10 after the output of the low-speed signal [Step 7], the printed circuit board 5 is determined to have been placed in the intended position, and drive-stop signals are output to the driving motors 7. After the stop signals for the driving motors 7 are detected [Step 8], the control unit 13 lifts the positioner 12 up to the transfer surface, and the printed circuit board 5 is thereby securely held in the intended position.

Further, if a slowdown signal is output but no detection signal from the positioning detector 10 is output after a lapse of a standby period, and a drive-stop signal is output from the driving motor 7 [Step 9], a slip is determined to have occurred between the conveyor belt 6 and the printed circuit board 5 (in a state where the printed circuit board 5 is transferred at a lower speed than the conveyor belt 6). In this case, the control unit 13 outputs a low-speed signal to each driving motor 7 to cause the conveyor belt 6 to run at a low speed [Step 6'].

And, in response to a detection signal from the positioning detector 10 after the output of this low-speed signal [Step 7'], the printed circuit board 5 is determined to have been placed in the intended position, and drive-stop signals are output to the driving motors 7. After the stop signals for the driving motors 7 are detected [Step 8'], the control unit 13 lifts the positioner 12 up to the transfer surface, and the printed circuit board 5 is thereby securely held in the intended position.

As described above, the embodiment of the present invention provides for a configuration comprising the conveyor belts 6 fitted to the conveyor frames 4 via the pulleys 3; the driving motors 7 for running the conveyor belts 6; the stopper 9 retractable from the transfer surface; the positioning detector 10 for detecting the printed circuit board 5 having hit the stopper 9; the arrival detector 11 for detecting the printed circuit board 5 having arrived in a starting position to start its transfer and in a prescribed position on the way to the intended position where its transfer ends; the positioner 12 for placing the printed circuit board 5 in a certain state in the intended position; and the control unit 13 for controlling the driving of driving motors 7 in accordance with detection signals from the positioning detector 10 and the arrival detector 11, wherein the printed circuit board 5 is switched from a high-speed transfer to a low-speed transfer and if the printed circuit board 5 hits the stopper 9 and bounces back, or if a slip occurs between the conveyor belt 6 and the printed circuit board 5 to cause the printed circuit board 5 to stop in a position where it is unable to hit the stopper 9, the control unit 13 outputs a low-speed signal to the driving motors 7 until the printed circuit board 5 hits the stopper 9 to ensure the transfer of the printed circuit board 5 to the intended position. Therefore, in spite of its simple configuration, the apparatus can accomplish accurate positioning of the printed circuit board 5 quickly and reliably without inviting any dislocation of or occurrence of defects in the electronic components mounted on the printed circuit board 5.

As clearly demonstrated by the foregoing description, the present invention provides for a configuration comprising driving units for driving conveyor belts for seating a printed circuit board thereon; a stopper for placing the printed circuit board in an intended position; a positioning detector for detecting the printed circuit board having hit the stopper; an arrival detector for detecting the printed circuit board having arrived in a prescribed position before the intended position where its transfer ends; and further a control unit for controlling the driving of the driving units in accordance with detection signals from the positioning detector and the arrival detector. If the transfer speed of the conveyor belts is started to slow down when the printed circuit board has arrived in a prescribed position before the intended position, and the printed circuit board does not hit the stopper by the time the conveyor belts stop after their transfer speed is started to slow down, the conveyor belts are driven again to run until the printed circuit board hits the stopper, and if the printed circuit board hits the stopper and bounces back by the time the conveyor belts stop after their transfer speed is started to slow down, the conveyor belts are driven again to run at a low speed until the printed circuit board hits the stopper, with the result that, in spite of its simple configuration, the apparatus can accomplish accurate positioning of the printed circuit board quickly and reliably without inviting any dislocation of or occurrence of defects in the electronic components mounted on the printed circuit borad.

What is claimed is:

1. An apparatus for transferring printed circuit boards which has conveyor belts for seating a printed circuit board thereon, driving units for running said conveyor belts, a stopper for placing said printed circuit board in an intended position, a positioning detector for detecting said printed circuit board having hit said stopper, an arrival detector for detecting said printed circuit board having arrived in a prescribed position before the intended position where said printed circuit board ends its transfer, and a control unit for controlling the driving of said driving units in accordance with detection signals from said positioning detector and said arrival detector, characterized in that:

said control unit has a function to output a slowdown signal to said driving units according to a detection signal from said arrival detector;

a function to effect a delay by a prescribed period of time to stand by for a detection signal from said positioning detector, when a detection signal from said positioning detector and drive-stop signals from said driving units are output after a lapse of a standby period following the output of said slowdown signal;

a function to determine that said printed circuit board has been placed in the intended position according to said detection signal output after the delay by said prescribed period of time;

a function to output a low-speed signal to said driving units to drive said conveyor belts at a low speed when no detection signal is output after the delay by said prescribed period of time; and a function to determine that said printed circuit board has been placed in the intended position by outputting a drive-stop signal to said driving units in accordance with a detection signal from said positioning detector after the low-speed signal is output.

2. An apparatus for transferring printed circuit boards which has conveyor belts for seating a printed circuit board thereon, driving units for running said conveyor belts, a stopper for placing said printed circuit board in an intended position, a positioning detector for detecting said printed circuit board having hit said stopper, an arrival detector for detecting said printed circuit board having arrived in a prescribed position before the intended position where said printed circuit board ends its transfer, and a control unit for controlling the driving of said driving units in accordance with detection signals from said positioning detector and said arrival detector, characterized in that:

said control unit has a function to output a slowdown signal to said driving units according to a detection signal from said arrival detector;

a function to output a low-speed signal to said driving units to drive said conveyor belts at a low speed when no detection signal is output from said positioning detector and drive-stop signals are output from said driving units after a lapse of a standby period following the output of said slowdown signal; and a function to determine that said printed circuit board has been placed in the intended position by outputting a drive-stop signal to said driving units in accordance with a detection signal from said positioning detector after the low-speed signal is output.

3. An apparatus for transferring printed circuit boards which has conveyor belts for seating a printed circuit board thereon, driving units for running said conveyor belts, a stopper for placing said printed circuit board in an intended position, a positioning detector for detecting said printed circuit board having hit said stopper, an arrival detector for detecting said printed circuit board having arrived in a prescribed position before the intended position where said printed circuit board ends its transfer, and a control unit for controlling the driving of said driving units in accordance with detection signals from said positioning detector and said arrival detector, characterized in that:

said control unit has a function to output a slowdown signal to said driving units according to a detection signal from said arrival detector;

a function to effect a delay by a prescribed period of time, and standing by for a detection signal from said positioning detector, when a detection signal from said positioning detector and drive-stop signals from said driving units are output after a lapse of a standby period following the output of said slowdown signal;

a function to determine that said printed circuit board has been placed in the intended position according to said detection signal output after the delay by said prescribed period of time;

a function to output a low-speed signal to said driving units to drive said conveyor belts at a low speed when no detection signal is output after the delay by said prescribed period of time; and a function to determine that said printed circuit board has been placed in its intended position by supplying a drive-stop signal to said driving units in accordance with a detection signal from said positioning detector after this low-speed signal is supplied; said control unit further having:

a function to output a low-speed signal to said driving units to drive said conveyor belts at a low speed when no detection signal is output from said positioning detector and drive-stop signals are output from said driving units after the lapse of a standby period following said output of said slowdown signal; and a function to determine that said printed circuit board has been placed in the intended position by outputting a drive-stop signal to said driving units in accordance with a detection signal from said arrival detector after the low-speed signal is output.

4. A method for transferring printed circuit boards by seating a printed circuit board in a transfer-starting position on conveyor belts, and driving said conveyor belts to transfer said printed circuit board to an intended position where said printed circuit board hits a stopper, characterized in that:

said transfer speed of said conveyor belts is started to slow down when said printed circuit board has arrived in a prescribed position before the intended position and, if said printed circuit board does not hit said stopper by the time said conveyor belts stop after their transfer speed is started to slow down, said conveyor belts are driven again at a slow speed until said printed circuit board hits said stopper.

5. A method for transferring printed circuit boards by seating a printed circuit board in a transfer-starting position on conveyor belts, and driving said conveyor belts to transfer said printed circuit board to an intended position where said printed circuit board hits a stopper, characterized in that:

said transfer speed of said conveyor belts is started to slow down when said printed circuit board arrives in a prescribed position before the intended position and, if said printed circuit board hits said stopper and bounces back by the time said conveyor belts stop after said transfer speed of said conveyor belts is started to slow down, said conveyor belts are driven again at a slow speed until said printed circuit board hits said stopper.

6. A method for transferring printed circuit boards by seating a printed circuit board in a transfer-starting position on conveyor belts, and driving said conveyor belts to transfer said printed circuit board to an intended position where said printed circuit board hits a stopper, characteristic in that:

said transfer speed of said conveyor belts is started to slow down when said printed circuit board has arrived in a prescribed position before the intended position and, if said printed circuit board does not hit said stopper by the time said conveyor belts stop after their transfer speed is started to slow down, said conveyor belts are run again until said printed circuit board hits said stopper and, if said printed circuit board hits said stopper and bounces back by the time said conveyor belts stop after their transfer speed is started to slow down, said conveyor belts are driven again at a slow speed until said printed circuit board hits said stopper.

* * * * *